US008815627B2

(12) United States Patent
Monnet et al.

(10) Patent No.: US 8,815,627 B2
(45) Date of Patent: Aug. 26, 2014

(54) METHOD OF MANUFACTURING AN IONIZING RADIATION DETECTION DEVICE

(75) Inventors: Olivier Monnet, Tullins (FR);
Guillaume Montemont, Grenoble (FR);
Loick Verger, Grenoble (FR);
Marie-Claude Gentet, Crolles (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 91 days.

(21) Appl. No.: 13/170,819

(22) Filed: Jun. 28, 2011

(65) Prior Publication Data

US 2012/0056287 A1    Mar. 8, 2012

(51) Int. Cl.
*H01L 21/00* (2006.01)
*H01L 31/08* (2006.01)
*H01L 31/0224* (2006.01)
*G01T 1/24* (2006.01)

(52) U.S. Cl.
CPC ............... *G01T 1/24* (2013.01); *H01L 31/085* (2013.01); *H01L 31/0224* (2013.01)
USPC .............................................. 438/56; 438/98

(58) Field of Classification Search
USPC ............... 438/56, 98; 257/428–430, E31.124
See application file for complete search history.

(56) References Cited

U.S. PATENT DOCUMENTS

| 7,205,548 | B2 * | 4/2007 | Pang et al. ................ 250/370.14 |
| 8,236,598 | B2 * | 8/2012 | Khadilkar et al. .............. 438/72 |
| 2002/0036269 | A1 | 3/2002 | Shahar et al. |
| 2003/0021382 | A1 | 1/2003 | Iwanczyk et al. |
| 2004/0087061 | A1 * | 5/2004 | Ma et al. ........................ 438/122 |
| 2005/0247880 | A1 * | 11/2005 | Wear ........................ 250/370.01 |
| 2006/0160014 | A1 * | 7/2006 | Nagahara et al. .......... 430/270.1 |
| 2009/0236535 | A1 * | 9/2009 | Soldner ................... 250/370.13 |

FOREIGN PATENT DOCUMENTS

| EP | 1 739 458 A1 | 1/2007 |
| WO | WO 2008/054862 A2 | 5/2008 |
| WO | WO 2009/101670 A1 | 8/2009 |

* cited by examiner

*Primary Examiner* — Kevin Parendo
(74) *Attorney, Agent, or Firm* — Brinks Gilson & Lione (57) ABSTRACT

A method for manufacturing an ionizing radiation detection device having a block of a semiconductor material adapted to undergo local separations of charges between positive and negative charges under the effect of ionizing radiation. The device including a first series of at least two collecting electrodes formed on the surface of the semiconductor block, and a second series of at least two non-collecting electrodes formed on a support and separated from the semiconductor block by an insulating layer. During processing, after forming the insulating layer on the support so as to cover the non-collecting electrodes, the block of semiconductor material bearing the collecting electrodes and the support bearing the non-collecting electrodes and the insulating layer are assembled.

13 Claims, 4 Drawing Sheets

METHOD OF MANUFACTURING AN IONIZING RADIATION DETECTION DEVICE

PRIORITY CLAIM

This application claims priority to French patent application No. 1055239, filed Jun. 29, 2010 the disclosure of which is hereby incorporated by reference herein.

TECHNICAL FIELD

The present invention relates to a device for detecting ionizing radiation, for example gamma radiation, with spatial resolution, as well as to a method for manufacturing such a device. The device may be used in the field of safety, or for scientific or medical imaging studies, such as single-photon emission computed tomography (SPECT).

BACKGROUND

Detectors are known using a semiconductor crystal, for example of cadmium telluride (CdTe) or cadmium zinc telluride (CdZnTe), within which an electric field is applied by an anode and a cathode disposed on opposite sides of the crystal.

The ionizing radiation interacting with the crystal gives rise to charge separations, that is to say the formation of electron-hole pairs, the electron and the hole, initially formed at the same location, rapidly migrating under the effect of the electric field in opposite directions. It is then possible to collect the electrons and/or the holes, that is to say to form an electrical signal from the charges flowing towards the anode and/or from the charges flowing towards the cathode, the electrical signal thus measured reflecting the interaction of the ionizing radiation in the semiconductor.

It should be specified that in addition to gamma radiation, alpha radiation, beta radiation, X-rays and neutrons may be detected using such semiconductor detectors.

The known semiconductor detectors with two-dimensional spatial resolution give better perspectives with regard to spatial resolution than the more widespread detectors based on the scintillation of a crystal or of a plastic in reaction to photons, X- or gamma rays.

Semiconductor detectors with spatial resolution are in particular capable of enabling medical imaging to be performed, based on the use of a gamma radiation emitting radioactive product injected into the patient or into an animal and selectively fixing in its body.

Thus semiconductor detectors are known that use a cathode on one face of the semiconductor crystal, and a rectangular array of pixels forming anodes on the other face, each pixel defining both an X-coordinate and a Y-coordinate.

Such a structure is referred to as an "$n^2$" structure, n designating the number of anode pixels aligned with one of the sides of the semiconductor, which is considered to be square. It is complex to implement when the value of n increases, since it is necessary to put in place contacts and electrical conductors to extract the signal from each pixel, and to install a high number of channels for processing the signals.

Thus, this solution becomes of low practicability when the needs for spatial resolution and for detection area increase. However, in medical matters, the spatial resolution desired is less than a millimeter, and it is necessary to have available a field of view of several square centimeters (field 5×5 cm$^2$ for applications on a small animal). Furthermore, it is desirable for the detectors and the electronics they carry to occupy a compact volume, so as to make them easier to manipulate in a restricted space, such as in the field of medical imaging, in which it is necessary to place the detector as close as possible to the organ under study, whereas the access to that organ may be awkward.

Structures enabling the installation of a fewer number of electronic channels while maintaining good spatial resolution are thus sought.

Structures designated under the generic term of "2n" structures are known in particular.

In the case of the semiconductors for which the electrons and the holes do not migrate at the same speed, which is the case for CdZnTe or for CdTe, these structures generally comprise a cathode on one face of the semiconductor crystal, and use two series of electrodes on the opposite face, the electrodes extending along one or other of the dimensions of the surface of the crystal. The designation "2n" thus means that although it is desired to produce an imager with n$^2$ pixels, it is not a matter of using n$^2$ pixelized anodes on the surface of the semiconductor material, but n elongate electrodes forming a first series of electrodes and n other electrodes, also elongate, forming a second series of electrodes.

The electrodes of the first series define the X coordinate and are deposited directly on the semiconductor material. These are collecting electrodes, since they collect charge carriers migrating in the detector. When those carriers are electrons, the collecting electrodes are anodes.

The electrodes of the second series are disposed transversely to the collecting electrodes, and define the Y-coordinate. These electrodes are not in electrical contact but are capacitively coupled with the semiconductor crystal. They do not collect charge carriers, but produce a signal induced by the movement of charge carriers in the detector material, including a maximum and a minimum potential. They are thus referred to as non-collecting electrodes.

In U.S. Pat. No. 6,037,595, such a "2n" system, called "cross-strip detector" is disclosed.

The electrodes of a first series of electrodes are constructed by the use of localized anodes, deposited on the semiconductor material and linked together in columns by conductive cables passing at a distance from the semiconductor material.

Electrodes originally put in place on the surface of the semiconductor to protect the localized anodes in relation to electrostatic effects induced remotely by the movement of the electrons and holes in the semiconductor volume are used to form the second series of electrodes. They are organized in the form of lines, and are also linked by conductive cables passing at a distance from the semiconductor material. As these electrodes do not collect electrons but only measure induced effects, they are referred to as "non-collecting".

A variant described in this patent uses a layer of insulating material to separate the detector material and the non-collecting electrodes; this layer of insulating material is deposited on the face of the detector. The non-collecting electrodes are then either formed on the insulating layer, or are formed on a separate substrate, which is then mounted on the insulating layer.

PCT Pat. Pub. No. WO2008/054862 also describes a detector having a "2n" type structure and comprising a volume 2 of semiconductor material, a cathode 4 on one face of that volume, an anode structure 6 on the opposing face, the latter comprising a first series of conductor bands 8 (collecting anodes) on the face of the semiconductor material and a second series of conductor bands 12 (non-collecting anodes) separated from the collecting anodes by a layer of insulating material 26, which may be AlN, Al$_2$O$_3$ or Si$_3$N$_4$. The insulating material may be deposited by sputtering or evaporation. The sputtering may lead to a heterogeneous insulating layer being obtained, strewn with air bubbles, and of uneven thickness. The evaporation only takes place at high temperature and is thus not without risk for the semiconductor crystal whose properties are generally very temperature-sensitive. The manufacturing methods proposed are not satisfactory therefore.

Furthermore, to ensure that the electrons are actually collected by the localized anodes, a focusing grid kept at a potential intermediate between the cathode and anode potentials is sometimes used to direct the electrons. This focusing grid may also be referred to as a non-collecting electrode since it is separated from the semiconductor by an insulating layer and collects no electron.

From U.S. Pat. Pub. No. 2002/0036269 in particular, a coincidence detection device is known comprising at least two semiconductor detector crystals, each crystal bearing pixellated anodes on a first face and segmented cathodes on a second face, each pixellated anode being connected to an electronic channel for collecting signals representing the energy of the photons interacting in the crystal, each segmented cathode being connected to an electronic channel for collecting coincidence trigger signals. In an embodiment illustrated in FIGS. 3A and 3B of this published patent application, a non-collecting focusing grid 212 is formed between the pixellated anodes. An insulating layer 210 (of grid form) extends between the first face of the crystal and the focusing grid. As indicated [0068], the insulating material can be painted, sprayed, deposited, chemically passivated bonded, bonded or vaporized onto the face of the crystal. As explained earlier, these methods are not fully satisfactory.

Figure 7:
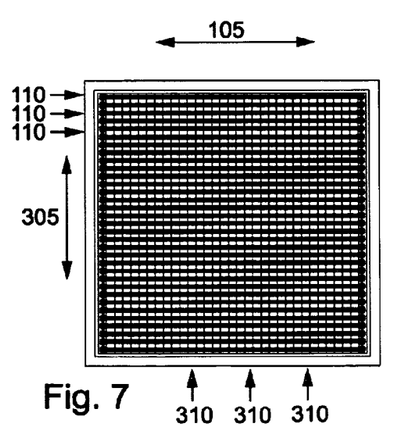
FIG. 7 illustrates a device according to an embodiment of the invention, the semiconductor being represented as transparent to reveal the two series of anodes of the device.

In another embodiment illustrated in FIG. 7 of U.S. Pat. Pub. No. 2002/0036269, the detector includes as earlier a crystal and pixellated anodes. Furthermore, a printed circuit board bearing pixellated contacts (612) and a focusing grid (616) is juxtaposed against the detector: the contacts (612) are bonded to the pixellated anodes (606) of the detector using a conducting adhesive. The space between the contacts (612), the anodes (606) and the gird (616) is filled with an insulating polymer material (622) in the liquid state using a wick ([0098]). This insulating layer 622 is formed during or after the assembly of the detector 602 and the printed circuit board 610 ([0099]). The insulating material brought to a high temperature then enters into contact with the detector, which may damage the latter. Furthermore, the operation of injecting insulating material into the narrow space destined to receive it is awkward and difficult to implement industrially. Separating the detector and the printed circuit board with the aim of facilitating the distribution of the insulating material would lead to an insulating layer that is too thick being obtained.

In the technical article "Single-sided CZT Strip detectors" (J. Macri et al., IEEE, Vol 51, No. 5, October 2004), instead of using a focusing grid, the non-collecting electrodes are themselves brought to a potential intermediate between the cathode and anode potentials.

In both cases, the installation of the conductor cables, outside the plane of the localized anodes, considerably complicates the manufacture, in particular when the needs for spatial resolution or area increase. The use of different potentials for the two series of anodes or for the focusing grid also constitutes a difficulty, since surface currents appear when the surface state of the semiconductor or of the other materials used is not perfect.

Furthermore, a production method according to a variant of U.S. Pat. No. 6,037,595 requires the use of a dielectric material which can be deposited at a temperature capable of being withstood by the semiconductor material on which the deposition is made. Failing this, the semiconductor material is deteriorated. This temperature condition is particularly limiting where the semiconductor material comprises CdTe or CdZnTe, such materials degrading (loss of spectro properties, in particular) as soon as the temperature exceeds 80° C.

From European Pat. No. EP1739458 a detector is also known using two series of electrodes disposed in two separate planes parallel to the surface of the semiconductor, still on the same side thereof, the electrodes being in the form of strips and both series of electrodes being separated by an electrically insulating material. The thickness of the latter is adjusted to obtain a compromise between detection of the induced signal and insulation of the non-collecting electrodes.

During the manufacture of such a device, the deposition of an insulating material on the surface of the semiconductor is awkward, since at low temperature, adhesion is liable to be insufficient and the thickness poorly controlled, and at high temperature, the semiconductor is liable to be damaged.

Furthermore, it is naturally desirable to improve the ratio between the signal measured by the non-collecting electrodes and the noise to which the latter are subjected, in particular the noise appearing by capacitive effect, on account of the collection of charges by the collecting anodes situated nearby.

SUMMARY

In this context, the present invention is directed to providing a method for manufacturing semiconductor detectors in which the semiconductor is not subjected to temperatures liable to degrade its properties.

The invention is in particular directed to providing a manufacturing method particularly adapted to the manufacture of detectors with "2n" type structures, which makes it possible to obtain an insulating layer (between the collecting electrodes and the non-collecting electrodes) that is homogenous, free of air bubbles and of controlled thickness, while avoiding the risk of degrading the semiconductor. Such a method is also advantageous for manufacturing detectors of "$n^2$" type structure (pixellated anodes) having a focusing grid.

The invention is also directed to providing new detectors having improved performance in terms of signal to noise ratio obtained at the non-collecting electrodes.

Another object of the invention is to provide a method of manufacturing semiconductor detectors that is easy to implement for large series of devices, for devices with a high spatial resolution, and for devices of large size.

To that end, the invention provides a method for manufacturing an ionizing radiation detection device, said device comprising:

a block, referred to as semiconductor block, of a semiconductor material adapted to undergo local separations of charges between positive and negative charges under the effect of ionizing radiations, a first series of at least two electrodes referred to as collecting electrodes, in electrical contact with the semiconductor block, a second series of at least two electrodes referred to as non-collecting electrodes, separated from the semiconductor block by a layer, referred to as insulating layer, of an electrically insulating material.

The method according to the invention comprises the following steps:

forming the collecting electrodes on a face of the semiconductor block, forming the non-collecting electrodes on a face of a support.

The method according to the invention is characterized in that, after having formed the insulating layer on the support so as to cover the non-collecting electrodes, it comprises assembling the semiconductor block bearing the collecting electrodes and the support bearing the non-collecting electrodes and the insulating layer.

By virtue of this method, it is possible to prepare the insulating layer at high temperature in advance, with controlled thickness, flatness and adhesion and without risking damage to the semiconductor since the insulating layer is formed uniquely on the support and not against the semiconductor block, which enables the remarkable properties of the semiconductor material to be preserved.

This method thus also enables a dielectric material to be chosen without being limited by the maximum temperature that can be withstood by the semiconductor material.

Lastly, this method enables the presence of undesirable material to be better controlled, and in particular air bubbles, between the non-collecting electrodes and the semiconductor block.

For all these reasons, it leads to a clear improvement of the signal to noise ratio obtained at the non-collecting electrodes.

Advantageously, the collecting electrodes are linear; in other words they take the form of strips. Preferably, the strips forming the collecting electrodes are deposited on the surface of the semiconductor block by lithography.

Advantageously, the non-collecting electrodes are formed on the surface of the support using a printed circuit manufacturing method. For example, two successive deposits are carried out by screen printing.

Advantageously and according to the invention, the insulating layer is formed by deposition of the insulating material in the liquid state on the support.

One of the essential contributions of the method according to the invention is that it enables the insulating material to be freely chosen. It is hence possible to use a dielectric material whose characteristics make it possible to overcome the difficulties encountered through experience in the use of the structures described in the prior art. In particular, the inventors have discovered that it is advantageous for the electrically insulating material to have a resistivity greater than or equal to $10^{11} \Omega \cdot cm$, and a relative dielectric permittivity greater than 5, these ranges of values enabling excellent results to be achieved in terms of signal to noise ratio obtained at the non-collecting electrodes. Preferably, the electrically insulating material has a relative permittivity comprised between 5 and 15, and a resistivity comprised between $10^{11}$ and $10^{12} \Omega \cdot cm$.

The invention extends to devices that can be obtained by the method according to the invention and in particular to a device for detecting ionizing radiations comprising:
  a block, referred to as semiconductor block, of a semiconductor material adapted to undergo a local separation of charge between positive and negative charges under the effect of an ionizing radiation,
  a first series of at least two electrodes referred to as collecting electrodes, in electrical contact with the semiconductor block,
  a second series of at least two electrodes referred to as non-collecting electrodes, carried by a support and separated from the semiconductor block by a layer, referred to as insulating layer, of an electrically insulating material,
  characterized in that the electrically insulating material forming the insulating layer has a resistivity greater than $10^{11} \Omega \cdot cm$ and a relative dielectric permittivity greater than 5. Preferably, the electrically insulating material has a relative permittivity comprised between 5 and 15, and a resistivity comprised between $10^{11}$ and $10^{12} \Omega \cdot cm$.

Such a device has improved performance with regard to spatial resolution, the noise experienced by the non-collecting electrodes being particularly low for material thicknesses enabling the measurement of an exploitable induced signal. The ratio of signal measured by the non-collecting electrodes to noise experienced by those electrodes is thus particularly high. Manufacture of the device is facilitated since the thickness of dielectric material does not need to be particularly small.

The choice of a material having such particular properties goes against the teachings of the prior art which either taught to adapt the thickness of the material to its permittivity or taught to use a focusing grid to direct the electrons towards the collecting electrodes, the dielectric material then being merely optional.

In certain embodiments, the relative permittivity of the dielectric material is greater than 10. With such a permittivity, the signal induced on the non-collecting electrodes is less dependent on local variations in thickness of the dielectric material, or on the presence of heterogeneities between the detector material and the non-collecting electrodes, such heterogeneities being for example air bubbles or impurities in the dielectric material.

According to another definition of the invention, the insulating material furthermore has a resistivity greater than 10 times that of the semiconductor material. This last feature enables good capacitive coupling between the non-collecting electrodes and the semiconductor material.

According to another aspect of the invention, the geometry of the electrodes, and in particular the form of the non-collecting electrodes, satisfies certain conditions enabling the signal to noise ratio to be optimized.

According to this aspect, the invention consists of a device for detecting ionizing radiations comprising a block, referred to as semiconductor block, of a semiconductor material adapted to undergo a local separation of charges between positive and negative charges under the effect of an ionizing radiation, a first series of at least two electrodes referred to as collecting electrodes, in electrical contact with the semiconductor block, a second series of at least two electrodes referred to as non-collecting electrodes, carried by a support and separated from the semiconductor block by a layer, referred to as insulating layer, of an electrically insulating material, characterized in that at least one non-collecting electrode comprises at least two wide portions for measuring a signal induced by the movements of charge in the semiconductor block, and in that at least one collecting electrode extends opposite a space between the two wide portions.

This geometry enables a solid angle to be obtained by which the non-collecting electrode sees the semiconductor material that is less encumbered by the collecting electrodes proportionally to the area of the non-collecting electrode than in a structure of the prior art. The noise that is experienced by the non-collecting electrode is reduced and the induced signal measured by the non-collecting electrode is increased relative to the prior devices.

If the non-collecting electrode is manufactured in the form of a printed circuit deposited on a flat surface, the preceding feature is implemented by reducing the width of the electrode between the two wide portions, taking care however to keep sufficient width (at the location of the narrow portion of the electrode) for conduction.

If the electrode is manufactured by another way, for example with wired connections, the width of the narrow portion may be reduced to zero, the conduction then taking place in a plane behind the plane of the wide portions serving for the generation of the induced signal, in relation to the semiconductor.

According to still another aspect of the invention, the detection device is characterized in that at least one collecting electrode is in strip form and of width less than that of a non-collecting electrode. Preferably, the collecting electrodes all have widths (identical or different) that are less than the widths (identical or different) of the non-collecting electrodes.

This geometry of the electrodes also enables a solid angle to be obtained by which the non-collecting electrode sees the semiconductor material that is less encumbered by the collecting electrodes than a in structure according to the prior art. The ratio of signal produced by the non-collecting electrode to noise experienced by that electrode is thus increased relative to the prior devices.

Advantageously, the method according to the invention and/or the device obtained furthermore have one or more of the following features:
- the assembly of the semiconductor block and of the support is performed using an adhesive;
- the support is of ceramic, for example of alumina;
- the material used to form the insulating layer is a material known under the name ESL 4909-mod;
- at least one connection component is arranged in the support so as to make that connection component pass fully through the support and has a contact surface flush with the surface of the insulating layer after formation of that layer and in that the assembly is carried out so as to place in contact a collecting electrode and said connection component; the assembly may be carried out using a conductive adhesive disposed between a connection zone of said collecting electrode and the contact surface of said connection component.

BRIEF DESCRIPTION OF THE DRAWING

The invention will now be described with reference to the accompanying drawings.

DETAILED DESCRIPTION

Figure 1:
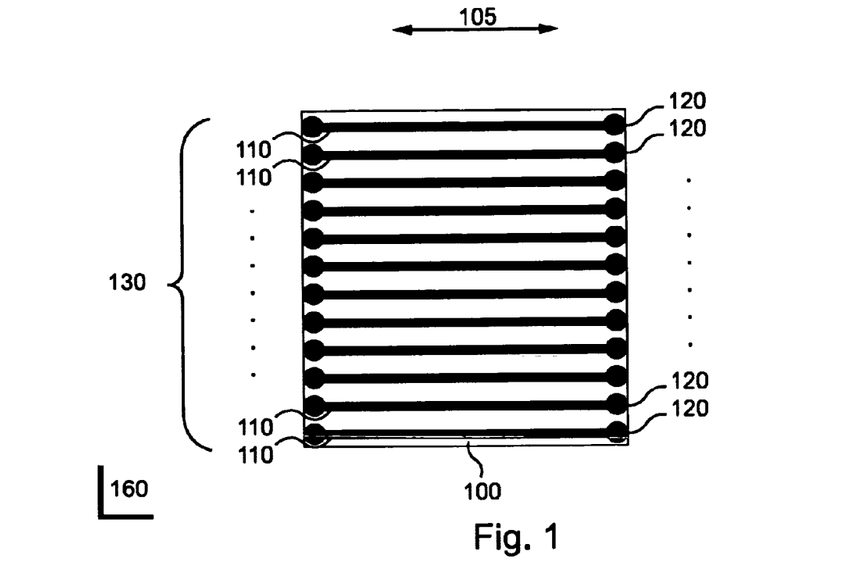
FIG. 1 is a face-on view of a semiconductor crystal further to a preliminary step of an embodiment of the method according to the invention.

In FIG. 1, a semiconductor crystal volume has been represented forming a parallelepiped semiconductor block 100, of square section, represented as seen from above, such that the FIG. shows the square upper face of the semiconductor block 100. The semiconductor material is of cadmium zinc telluride here. Other semiconductors materials may be used. The side of the square is of a few centimeters length, here 2.5 cm. On an upper face of the block 100 there are deposited metal strips 110, directly on the semiconductor material, the metal used here being gold, or according to a variant, platinum. Other conductive metals may be used.

In FIG. 1, twelve metal strips 110 can be seen extending parallel to each other in a direction 105 parallel to one of the sides of the square, referred to as first direction for the purposes of this disclosure. The strips 110 are formed directly on the surface of the semiconductor block 100 on its upper face; they are in electrical contact with the semiconductor material. They are thus adapted for collecting charge carriers, and will be called collecting electrodes or strips here. When the charge carriers are electrons, which is the most frequent case, those collecting strips are anodes. When the charge carriers are holes, those collecting strips are cathodes. In the following part of the description, the case will be considered for which those collecting strips are anodes, the detector material being CdTe.

The collecting strips 110 are distributed over the whole of the surface of the semiconductor block 100. Each of them is of constant width, the pitch between the strips, defined as the distance separating the central axes of two consecutive strips, is comprised between 500 µm and 1 millimeter, and in the embodiment presented is precisely 750 µm. The width of each collecting strip 110 is 150 µm, i.e. roughly $\frac{1}{5}^{th}$ of the pitch. The width of the collecting strips 110 is determined in accordance with the invention. The collecting strips 110 run over the entire length of one side of the semiconductor block 100. The thickness of the latter is 5 mm.

The set of collecting strips 110 constitutes a first series of electrodes 130. At each of the ends of each strip 110 there is a widened metal zone 120 referred to as connection zone 120 on account of its function.

The thickness of the collecting strips 110 is of the order of a few µm and, in the embodiment presented, is 3 µm, said collecting strips having been deposited by a conventional lithography technique.

The face of the semiconductor block bearing the collecting strips 110 has a surface 160 referred to as first surface for the purposes of the disclosure. As the thickness of the collecting strips 110 is small relative to the area of the upper face of the insulating block, the surface 160 formed by the collecting strips and by the portion of upper face of the semiconductor block extending between said strips is substantially flat.

In certain variants not represented, the width of the collecting strips 110 is not constant over their entire length, and in other variants, they are not all the same length or of the same shape.

Figure 2:
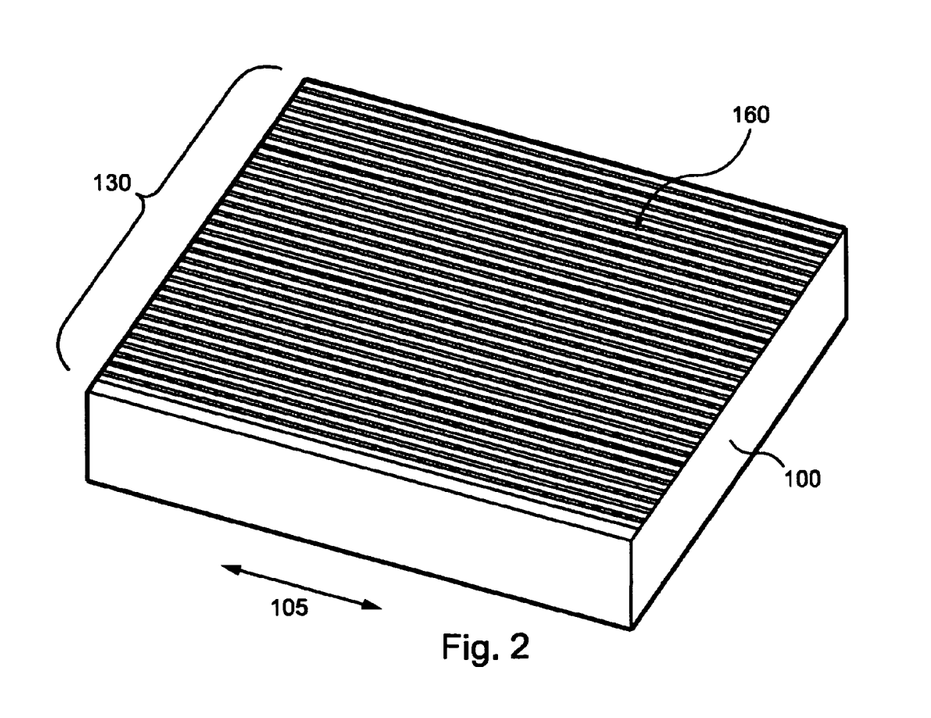
FIG. 2 is a three quarter view of the semiconductor crystal of FIG. 1 further to that preliminary step.

In FIG. 2, a semiconductor block 100 is shown that is similar to that shown in FIG. 1, this time in a three quarter view. A series 130 of electrodes can be seen, this time comprising thirty-two collecting electrodes (anodes) 110 of constant width. The semiconductor block 100 has a square front surface with sides of 2.5 cm. The pitch between the anodes 110 is 750 μm. The connection zones 120 do not appear in the Figure on account of their small size.

Figure 3:
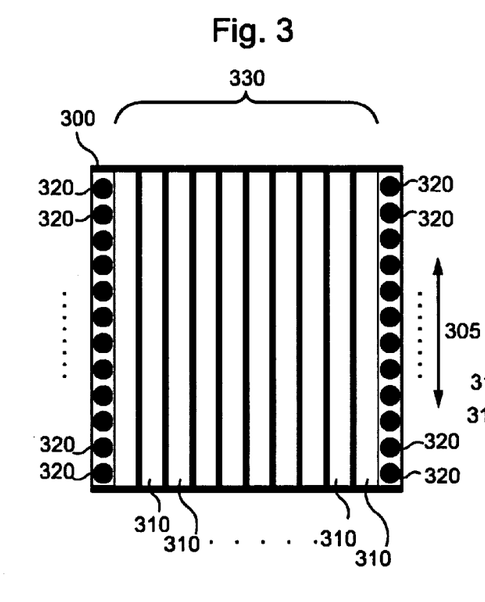
FIG. 3 is a face-on view of a support further to another preliminary step of the same embodiment of the method according to the invention.

FIG. 3 shows a support 300 on the surface of which are deposited metal strips 310: Ten metal strips 310 are shown here. The material constituting them may be gold or platinum or another conductive metal.

The strips 310 extend in a second direction 305 parallel to one of the sides of the support 300. In this example, the second direction 305 is, during the manufacturing method, placed at right angles to the first direction 105. The strips 310 constitute a second series 330 of electrodes. These strips 310 are not destined to collect charge carriers, but to be insulated from the detector material, so as to generate a signal induced by the movement of the charge carriers in that material. They are thus non-collecting electrodes. They are parallel to each other and disposed at a distance from each other corresponding to a pitch of 750 μm. Their width is 650 μm. The distance separating the edges adjacent two consecutive strips 310 is thus of the order of 100 μm, which ensures electrical insulation between two neighboring strips. In accordance with an advantageous aspect of the invention, the non-collecting strips 310 are wider than the collecting strips 110, and preferably between 2 and 5 times wider. In the embodiment presented, this ratio is 4.3, which, once the manufacturing process has finished, enables a particularly high signal to noise ratio to be obtained at the non-collecting electrodes.

Like the semiconductor block of FIG. 1, the support 300 is parallelepiped, of square section with a square lower face having sides of approximately 2.5 cm, the non-collecting strips 310 running along the whole length of one of the sides of the square. It is to be noted in FIG. 3 that the non-collecting strips 310 are of constant width, but according to variants, it is possible for their width not to be constant over their entire length. The impedance of the strips is limited.

The support 300 is a volume of ceramic, and more specifically it is 96% alumina here. The non-collecting strips 310 are deposited by screen printing, their preparation comprising a step of baking a conductive paste. Thus the non-collecting strips 310 each constitute a circuit printed on the support 300.

The support 300 may constitute a reading circuit box, carrying the electronics necessary for the processing of the signals collected at the different electrodes. The material constituting it has been chosen on account of its stiffness and its good level of mechanical stability, compatible with high temperature deposition processes. According to variants, other materials are used ($SiO_2$, epoxy or any insulating substrate adapted for the integration of electronic devices).

On the edges of two sides of the support 300, conductive contacts 320 are arranged. FIG. 3 shows two series of twelve conductive contacts 320 regularly spaced over both sides of the support 300, parallel to the non-collecting strips 310.

The thickness of the non-collecting strips 310 is, in one embodiment, approximately 10 μm. In another embodiment, the non-collecting strips are deposited in two passes each of 15 μm residual thickness each, i.e. with a final thickness of 30 μm. This enables the impedance of each strip to be reduced, which, in this example, is of the order of 2Ω.

Figure 4:
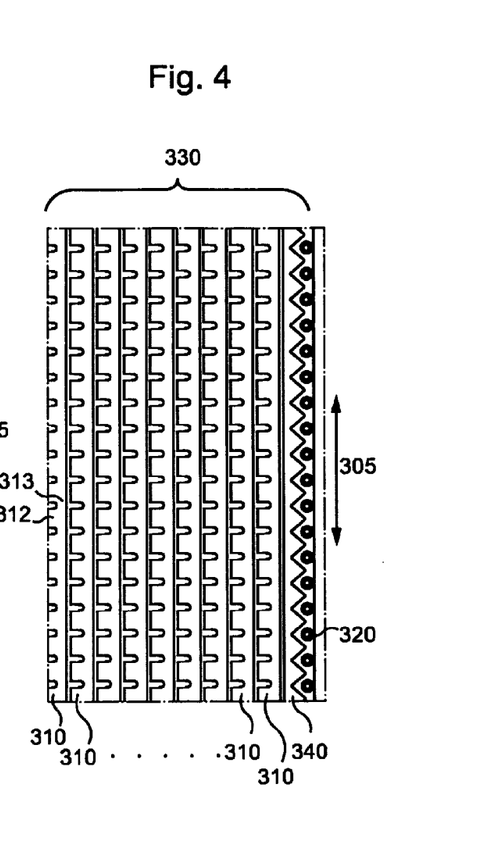
FIG. 4 is a face-on view of a support similar to that presented in FIG. 3, but in the context of a variant of the invention.

FIG. 4 shows a variant of a support as represented in FIG. 3. The support 300 carries a series 330 of non-collecting electrodes parallel to each other, but whose width is not constant. Thus, each non-collecting electrode 310 comprises a succession of wide portions 312 and narrow portions 313, in the form of a comb. This comb shape is defined by a continuity of material on one of the edges of the strip 310 and a crenellated shape on the other edge of the strip 310. While the width of the strip 310 is in the neighborhood of 700 μm in the wide portions 312, it is only 150 μm at the location of the narrow portions 313.

The width of the narrow portions 313 is adapted so as to obtain satisfactory conduction over the whole of the length of the strip 310, from one edge to the other of the support 300, i.e. over approximately 25 mm. The distance between two consecutive wide portions 312, at the location of a narrow portion 313 is approximately 150 μm. In the FIG. eighteen wide portions 312 can be seen, but in a preferred embodiment, each non-collecting electrode comprises 32 of them.

On each non-collecting strip 310, the narrow portions 313 are regularly distributed with a pitch equal to the pitch with which the collecting strips 110 are distributed over the volume of the semiconductor 100 (FIG. 1). The non-collecting strips 310 are furthermore disposed such that the successions of narrow portions 313 are made in a direction perpendicular to the direction 305.

Eighteen conductive contacts 320 can be seen on one of the edges of the support 300. They are adapted to enable the connection of the anodes 110, once the device has been assembled, as will be seen in FIGS. 6 and 8.

An electrode 340 having a similar function to the non-collecting electrodes 310 but having to face up to particular insulating constraints on account of the proximity of the conducting contacts 320 is present between the succession of conductive contacts 320 and the first crenellated non-collecting strip 310. The electrode 340 has a geometry of successive triangles.

In the embodiment presented, it has been seen that the non-collecting electrodes are manufactured in the form of printed circuits deposited on a flat surface. The comb form is obtained by reducing one width of the electrode between the two wide portions 312, but by keeping sufficient width for conduction at the location of the narrow portions 313.

If the non-collecting electrodes are manufactured in another way, for example with wire connections as presented in U.S. Pat. No. 6,037,595, the width of the narrow portion may be reduced to zero, the conduction then taking place in a plane behind the plane of the wide portions.

Figure 5:
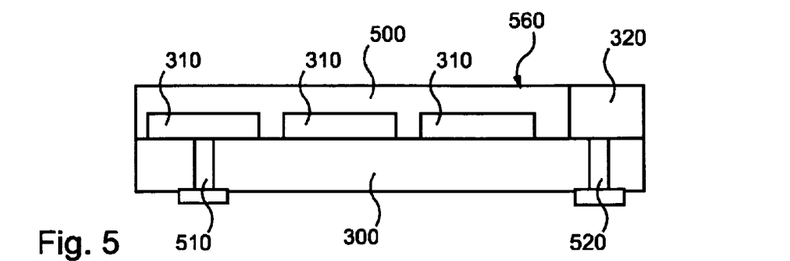
FIG. 5 illustrates a cross-section view of a support similar to those presented in FIGS. 3 and 4, at a later stage of a method according to an embodiment of the invention.

With reference to FIG. 5, once the support 300 has been prepared with the succession of strips 310 deposited on its surface, deposition is made of a dielectric or electrically insulating material over the whole surface of the strips 310 and of the empty spaces separating them, as well as the crenellations corresponding to the narrow portions 313. In an embodiment, this is carried out by a first step of depositing insulating material between the strips 310, then by a second step of depositing insulating material over the whole of the surface of the support 300.

The thickness of the dielectric material deposited on top of the non-collecting strips 310 is of the order of 10 μm and is adapted in particular to ensure that the entirety of the electrodes is actually covered. The dielectric material forms an insulating layer 500 presenting, on the opposite side to the support 300 and the strips 310, a flat surface 560, the roughness of which does not exceed a few μm. The strips 310 are embedded in that insulating layer 500.

The dielectric material used in a preferred embodiment is known as ESL 4909-mod commercialized by Electro Science Laboratories, of resistivity $10^{11}$Ω·cm and relative permittivity $\in_0$ equal to 9. The deposition is carried out in this case at 850° C. In other embodiments, it is performed at other temperatures, generally greater than 100° C.

Contrary to the devices of the prior art, the fact of depositing an insulating material on a support 300 separated from the semiconductor block 100 makes it possible to avoid the constraint of temperature it imposes. It is then possible to choose insulating materials deposited at high temperature, without risk of degradation to the semiconductor material forming the block 100.

Such a deposition at adapted temperature makes it possible to control the roughness of the surface 560 of the insulating layer, which surface is adapted to be applied against the face of the semiconductor block bearing the collecting electrodes 110 (anodes).

As the resistivity of the semiconductor is of the order of $10^{10}\Omega\cdot$cm, the resistivity of the dielectric material forming the insulating layer 500 is preferably less than 10 times greater. Thanks to this condition, the signal detected by the non-collecting electrodes 310 is not perturbed by the collection of charge carriers. It is found that the non-collecting electrodes 310 are sufficiently insulated.

If the chosen material has a relative permittivity and resistivity in compliance with the conditions of the invention, the signal produced by the non-collecting electrodes has a satisfactory signal to noise ratio. Such a material enables sufficient electrical insulation of the non-collecting electrodes 310 in relation to the semiconductor block 100, while enabling capacitive coupling between those electrodes and the semiconductor.

In variants, the thickness of the dielectric material separating the non-collecting electrodes and the collecting electrodes is a few tens of μm, for example from 2 to 50 μm.

It will be understood that, whatever their form, the non-collecting electrodes of the examples described previously are, in a plane parallel to the flat surface 560, elongated in the second direction 305.

In FIG. 5, a traversing connection 510 for one of the strips 310 has also been shown. This connection 510 traverses completely through the support 300 so as to enable the electrical connection of the non-collecting electrode 310 to a channel for electronic reading and measurement of the signal which is detected by that strip. Although they are not shown apart from the most leftward one, a traversing connection 510 is provided for each of the non-collecting strips 310.

A connection component is also represented in FIG. 5, comprising a contact 320 and a conductive rod 520. The conductive rod 520 passes through the support 300 so as to be able to connect the contact 320 to reading circuits to measure the electrical signals transmitted by the contact 320.

In the embodiment shown, the thickness of the contact 320 is equivalent to the cumulative thickness of the strips 310 and of the insulating material deposited thereon, which results in the contact 320 having a contact surface (upper surface in the Figure) which extends in line with the surface 560 of the insulating layer 500. This contact surface may also be slightly set back from the surface 560 (by a few μm), it being possible for the set back then to be occupied by adhesive, as will be understood from an examination of FIG. 6.

Figure 6:
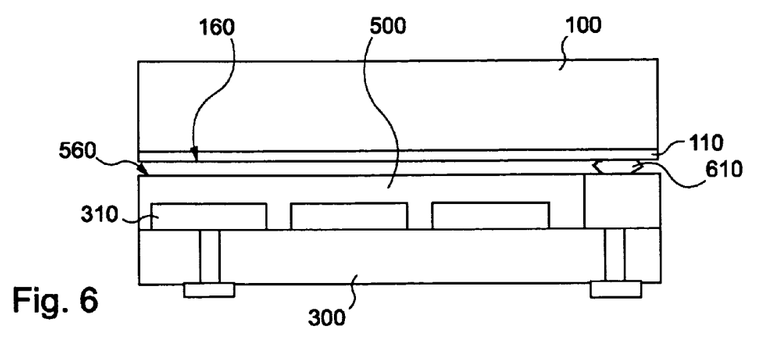
FIG. 6 illustrates the result of an assembly step during the implementation of an embodiment of the method according to the invention.

In FIG. 6 shows the assembly of the semiconductor block 100 of FIG. 2 with the laminated support 5. The first and second directions 105 and 305 are placed perpendicularly to each other and the surfaces 160 and 560 are presented face to face to each other. In a variant, without being placed perpendicularly to each other, the first and second directions are placed transversely to each other.

In a variant in which the support of FIG. 4 is used, the narrow portions 313 of the non-collecting electrodes are placed in vertical alignment with the collecting strips 110, each wide portion 312 then facing, through the dielectric material 500, a surface portion of the semiconductor block 100 devoid of collecting electrode 110. This makes it possible, once the manufacturing process has finished, to obtain a signal to noise ratio that is particularly high at the non-collecting electrodes. To be precise, by placing the narrow zones 313 in this way, the capacitive coupling between collecting electrode and non-collecting electrode is minimized, such a coupling being a source of noise affecting the signal delivered by the non-collecting electrodes.

The view of FIG. 6 shows the laminated support of FIG. 5 from the same angle as in that Figure, the semiconductor block 100 being placed such that a single first strip 110 is visible from left to right in the Figure.

Conductive adhesive 610 was placed in advance on the contact surface of contact 320 and thus contributes to immobilizing said contact 320 and the semiconductor block facing it. The surface 160 is presented such that each connection zone 120 faces a contact 320 and the adhesive 610 thus provides the fixing as well as the electrical contact of the collecting strip 110 (by its connection zone) with the contact 320. This thickness of adhesive will be chosen so as to be the smallest possible, for example of the order of a few μm to a few tens of μm.

The adhesive 610 used in one embodiment is a conductive adhesive curable at low temperature (by which is meant curable at a temperature less than 80° C.), and more particularly is the adhesive known as EG8050.

Thanks to the low degree of roughness of the surface 560, the presence of unintended air bubbles between the semiconductor block 100 and the non-collecting electrodes 310 is avoided, such air bubbles being liable to lead to random heterogeneities in the resistivity and the permittivity of the insulating layer. It can thus be understood that, with such a method, the resistivity and the permittivity of that layer are better controlled.

The detector is completed by a single cathode, which is flat and of square shape, positioned against the lower face of the semiconductor block 100. In an alternative embodiment, a cathode segmented into several elementary cathodes is used.

FIG. 7 shows a face-on view of the detector as obtained in FIG. 6. For the needs of the FIG., the semiconductor block 100 is shown transparent so as to make the electrodes 110 and 310 appear. The directions of these electrodes have been represented on the FIG., which are respectively the directions 105 and 305.

Figure 8:
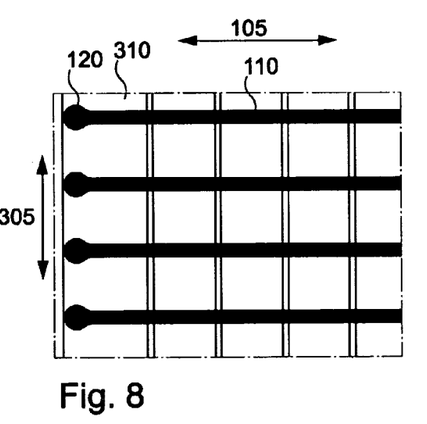
FIG. 8 illustrates details of the device of FIG. 6.

FIG. 8 presents an enlargement of the view of FIG. 7. In the foreground, a collecting strip 110 can be recognized, perpendicular to a non-collecting strip 310 and of substantially smaller width. A connection zone 120 for the retrieval of the signal measured by the collecting electrode 110 can also be recognized.

Figure 9:
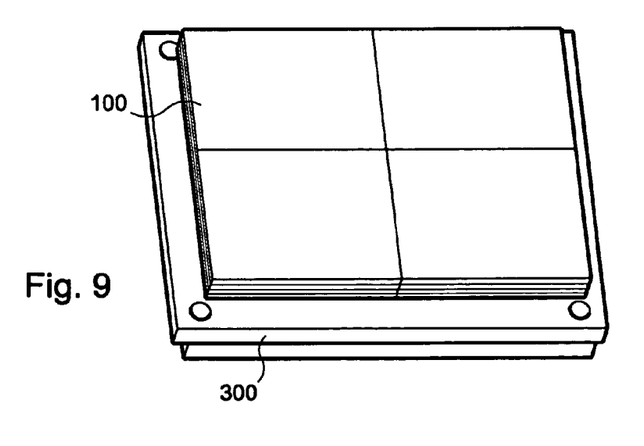
FIG. 9 illustrates a device according to an embodiment of the invention.

FIG. 9, is a ¾ view of a detection device comprising four detectors produced according to the invention and in a disposition joined to each other on the same support 300. The final device thus profits from a detection surface with sides measuring 5 cm in the two directions of its plane, without a blind zone, the detection surfaces being joined together. The connection means relative to all the electrodes, whether collecting or non-collecting, is placed within the support 300, so providing high compactness.

The device is electrically supplied, by applying a potential difference between each cathode and the strips 110 which serve as collecting anodes. In a preferred embodiment, the cathode is placed at a high negative potential, and the collecting anodes are at a common potential close to earth.

The strips 310 will serve as non-collecting electrodes, measuring the signal induced by the movement of the charges in the semiconductor block 100. The non-collecting electrodes are all placed at the same potential, which in an embodiment is the same as that of the collecting anodes. As a variant, the collecting anodes and the non-collecting electrodes are placed at different potentials. To be precise, the choice of a dielectric material as described previously makes the non-collecting electrodes electrically insulated both from the semiconductor block and from the collecting anodes.

Figure 10:
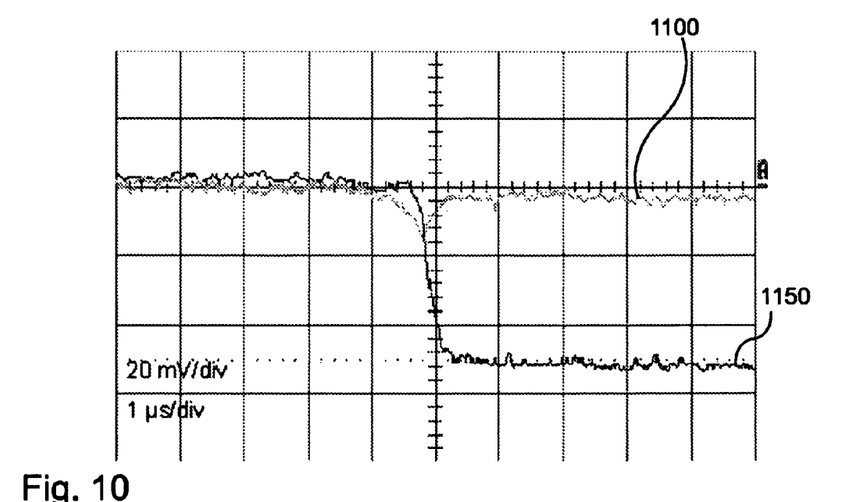
FIG. 10 shows a signal obtained on a non-collecting electrode of a device according to an embodiment of the invention.

FIG. 10 shows on the same graph a signal 1100 measured by a non-conducting electrode and a signal 1150 measured by a collecting electrode (anode) of the device according to the invention. The x-axis gives the time, with a graduation in μs, and the y-axis gives the potential difference measured. It can be seen that the potential of the anode undergoes a sudden drop of about 50 mV, and then stays substantially constant, whereas the potential of the non-collecting electrode undergoes a transitory reduction of about 16 mV, the latter rapidly returning to its initial value. The variation in potential of the non-collecting electrode starts slightly before the start of the variation in potential of the anode, as is expected for an induced signal. The signal to noise ratio observed at the non-collecting electrode is excellent, which enables the device to be used for detection with high spatial resolution.

Figure 11:
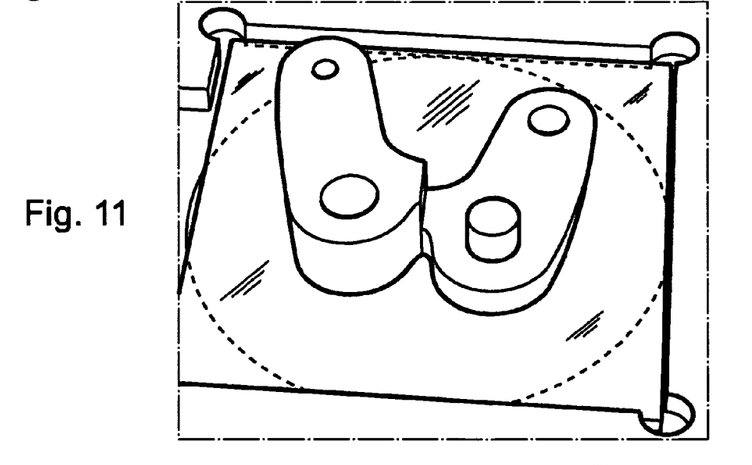
FIG. 11 shows a test object simulating a human organ, used to test the devices according to the invention.

FIG. 11 shows a test device simulating a human thyroid gland within which a gamma-ray emitting isotope is present, to reproduce the conditions of medical imaging experiments.

Figure 12:
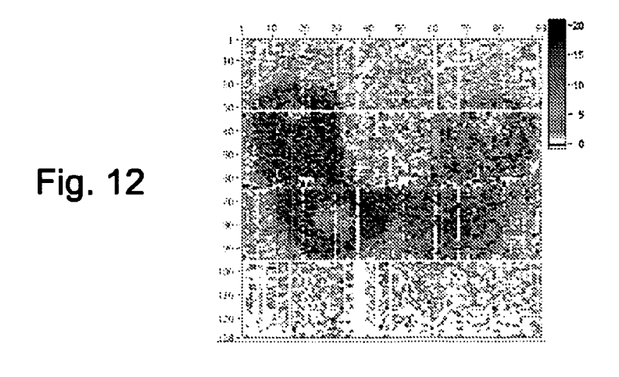
FIG. 12 shows an image obtained with a device according to an embodiment of the invention and the test object of FIG. 10, thus simulating a medical experiment, here with four juxtaposed detectors.

FIG. 12 shows the imaging result obtained according to the invention. It is remarkable that in that two-dimensional image the structure of the thyroid gland of FIG. 11 is to be found precisely, with fine image spatial resolution, and with high clarity and contrast.

Although it is presented above with a crystal of cadmium zinc telluride, the invention may be implemented with different semiconductor materials, such as gallium arsenide GaAs, silicon, mercury iodide $HgI_2$, titanium bromide TiBr or another appropriate material, preferably having a resistivity greater than $10^9 \Omega \cdot cm$, this enabling the number of charge separations appearing in the absence of any ionizing radiation to remain particularly limited.

Moreover, in alternative embodiments, the dielectric material 500 is a material known under the name Dupont 5704, of relative permittivity comprised between 8 and 10 and of resistivity close to $10^{12} \Omega \cdot cm$, or is ESL 4905C of $10^{11} \Omega \cdot cm$ resistivity and of relative permittivity comprised between 7 and 10. An exploitable signal has been obtained at the non-collecting electrodes for each of those dielectric materials. It is to be recalled that the resistivity of a detector material of CdZnTe type is of the order of $10^{10}$ or even $10^{11} \Omega \cdot cm$. The insulating materials used advantageously have a relative permittivity greater than 5, or preferably greater than 6, or even 8, and less than 10 or 15, and a resistivity comprised between $10^{11}$ and $10^{12} \Omega \cdot cm$.

The method is advantageous in a case where the support and the semiconductor block can be abutted: they can be joined in pairs and constitute detection devices of large area while minimizing blind areas, a blind area being a zone not contributing to the detection situated at the interface between two adjacent detectors.

The invention is not limited to the described embodiments but covers all the variants within the capability of the person skilled in the art.

The invention claimed is:

1. A method for manufacturing an ionizing radiation detection device comprising a semiconductor block of a semiconductor material that undergoes local separations of charges between positive and negative charges under ionizing radiation and further including collecting electrodes in electrical contact with the semiconductor block, and non-collecting electrodes separated from the semiconductor block by a non-electrically conductive insulating layer, the method comprising:
    forming the collecting electrodes on a surface of the semiconductor block;
    forming the non-collecting electrodes on a surface of a support; and
    depositing the non-electrically conductive insulating layer on the support at a temperature greater than 100° C. so as to encapsulate the non-collecting electrodes, the insulating layer comprising an insulating material having a relative permittivity of between 5 and 15, and a resistivity of between $10^{11}$ and $10^{12}$ ohm-cm, and
    after depositing the non-electrically conductive insulating layer on the support, assembling the semiconductor block bearing the collecting electrodes and the support bearing the non-collecting electrodes and the insulating layer, such that the non-collecting electrodes are electrically insulated from the collecting electrodes.

2. A manufacturing method according to claim 1, wherein forming the collecting electrodes comprises forming a stripe pattern.

3. A manufacturing method according to claim 2, wherein forming the collecting electrodes on the surface of the semiconductor block comprises a lithographic process.

4. A manufacturing method according to claim 1, wherein forming the non-collecting electrodes on the support comprises a printed circuit manufacturing method.

5. A manufacturing method according to claim 1, wherein depositing the non-electrically conductive insulating layer comprises depositing an insulating material in a liquid state on the support.

6. A manufacturing method according to claim 1, wherein assembling the semiconductor block and the support comprises using an adhesive.

7. A manufacturing method according to claim 1, further comprising forming at least one connection component arranged in the support so as to make the at least one connection component pass fully through the support and contact a surface flush with a surface of the insulating layer after forming the non-electrically conductive insulating layer, and wherein assembling the semiconductor block and the support is carried out so as to place at least one of the collecting electrodes in electrical contact with the at least one connection component.

8. A manufacturing method according to claim 7, wherein assembling the semiconductor block and the support comprises forming a conductive adhesive between a connection zone of the at least one collecting electrode and the contact surface of the at least one connection component.

9. A manufacturing method according to claim 1, wherein the insulating material comprises a dielectric material having a relative permittivity of 9, and a resistivity of $10^{11}$ ohm-cm.

10. A manufacturing method according to claim 1, wherein forming the collecting electrodes comprises forming at least one of the collecting electrodes to have a width less than that of at least one of the non-collecting electrodes.

11. A manufacturing method according to claim 1 further comprising forming at least one of the non-collecting electrodes with at least two widened portions to measure a signal induced by the movements of charge in the semiconductor block, and wherein assembling the semiconductor block and the support comprises placing at least one of the collecting electrodes opposite to a space between the two widened portions.

12. A manufacturing method according to claim 1, wherein the support comprises a ceramic material.

13. A manufacturing method according to claim 12, wherein the support comprises alumina.

\* \* \* \* \*

UNITED STATES PATENT AND TRADEMARK OFFICE
CERTIFICATE OF CORRECTION

| | | |
|---|---|---|
| PATENT NO. | : 8,815,627 B2 | Page 1 of 1 |
| APPLICATION NO. | : 13/170819 | |
| DATED | : August 26, 2014 | |
| INVENTOR(S) | : Olivier Monnet et al. | |

It is certified that error appears in the above-identified patent and that said Letters Patent is hereby corrected as shown below:

On the Title Page

Left column, after item (65), insert new item:

-- Foreign Application Priority Data

June 29, 2010    (FR)    1055239 --.

Signed and Sealed this

Thirteenth Day of January, 2015

Michelle K. Lee
*Deputy Director of the United States Patent and Trademark Office*